(12) United States Patent
Yin et al.

(10) Patent No.: US 6,189,484 B1
(45) Date of Patent: *Feb. 20, 2001

(54) PLASMA REACTOR HAVING A HELICON WAVE HIGH DENSITY PLASMA SOURCE

(75) Inventors: Gerald Zheyao Yin, Cupertino; Chii Guang Lee, Fremont; Arnold Kholodenko, San Francisco; Peter K. Loewenhardt; Hongching Shan, both of San Jose; Diana Xiaobing Ma, Saratoga; Dan Katz, Agoura Hills, all of CA (US)

(73) Assignee: Applied Materials Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/263,642

(22) Filed: Mar. 5, 1999

(51) Int. Cl.$^7$ .............................. C23C 16/00; H05H 1/00
(52) U.S. Cl. ............................... 118/723 I; 118/723 MA; 118/723 MR; 156/345
(58) Field of Search .................. 118/723 I, 723 MA, 118/723 MR, 723 E, 723 AN, 728, 719, 715; 156/345; 204/298.06

(56) References Cited

U.S. PATENT DOCUMENTS

| | | | |
|---|---|---|---|
| 4,716,491 | 12/1987 | Ohno et al. | 361/230 |
| 4,810,935 | 3/1989 | Boswell | 315/111.41 |
| 4,990,229 | 2/1991 | Campbell et al. | 204/298.06 |
| 5,091,049 | 2/1992 | Campbell et al. | 156/643 |
| 5,122,251 * | 6/1992 | Campbell et al. | 204/298.06 |
| 5,216,329 | 6/1993 | Pelleteir | 315/111.41 |
| 5,421,891 | 6/1995 | Campbell et al. | 118/723 R |
| 5,429,070 | 7/1995 | Campbell et al. | 118/723 R |
| 5,567,268 | 10/1996 | Kadomura | 156/345 |
| 5,580,385 * | 12/1996 | Paranjpe et al. | 118/723 I |
| 5,614,055 * | 3/1997 | Fairbairn et al. | 156/345 |
| 5,662,819 | 9/1997 | Kadomura | 438/711 |
| 5,846,329 | 12/1998 | Hori et al. | 118/723 E |
| 5,848,670 * | 12/1998 | Salzman | 118/728 |
| 6,015,465 * | 1/2000 | Kholodenko et al. | 118/719 |

FOREIGN PATENT DOCUMENTS

| | | |
|---|---|---|
| 0 495 524 A1 | 7/1992 | (EP) . |
| 0 838 842 A2 | 4/1998 | (EP) . |
| 0 845 800 A1 | 6/1998 | (EP) . |
| 92/14258 | 8/1992 | (WO) . |
| 97/08734 * | 3/1997 | (WO) ............................... H01J/37/32 |

OTHER PUBLICATIONS

A. K. Quick, R. T. S. Chen, N. Hershkowitz, "Etch Rate and Plasma Density Radial Uniformity Measurements in a Cusped Field Helicon Plasma Etcher", J. Vac. Sci. Technol. A 14(3), pp. 1041–1045, 1996.

Tynan, Bailey, Campbell, Charatan, de Chambrier, Gibson, Hemker, Jones, Kuthi, Lee, Wilcoxson, Shoji, "Characterization of an Azimuthally Symmetric Helicon Wave High Density Plasma Source", J. Vac. Sci. Technol., 1997. no volume or month.

* cited by examiner

*Primary Examiner*—Gregory Mills
*Assistant Examiner*—P. Hassanzadeh
(74) *Attorney, Agent, or Firm*—Thomason Moser Patterson

(57) ABSTRACT

A helicon wave, high density RF plasma reactor having improved plasma and contaminant control. The reactor contains a well defined anode electrode that is heated above a polymer condensation temperature to ensure that deposits of material that would otherwise alter the ground plane characteristics do not form on the anode. The reactor also contains a magnetic bucket for axially confining the plasma in the chamber using a plurality of vertically oriented magnetic strips or horizontally oriented magnetic toroids that circumscribe the chamber. The reactor may utilize a temperature control system to maintain a constant temperature on the surface of the chamber.

44 Claims, 9 Drawing Sheets

PLASMA REACTOR HAVING A HELICON WAVE HIGH DENSITY PLASMA SOURCE

This application contains subject matter that is related to U.S. patent application Ser. Nos. 09/521,799 filed Mar. 9, 2000 and 09/263,001 filed Mar. 5, 1999, both entitled "Magnetically Enhanced Inductively Coupled Plasma Reactor with a Magnetically Confined Plasma", herein incorporated by reference.

BACKGROUND OF THE DISCLOSURE

1. Field of the Invention

The invention relates to semiconductor wafer processing chambers and, more specifically, to a plasma reaction chamber having a helicon wave high density plasma source.

2. Description of the Background Art

Inductively coupled RF plasma reactors are employed to perform a variety of processes on workpieces such as semiconductor wafers. One type of inductively coupled RF plasma reactor has a process chamber including a ceiling (also referred to as a top, lid or roof) and a cylindrical side wall. A pedestal supports the workpiece, such as a semiconductor wafer, so that the wafer generally lies in a workpiece support plane, and a bias RF power generator is coupled to the pedestal. A generally planar coil antenna overlies the ceiling and is coupled to a plasma source RF power generator. With a process gas in the chamber, RF power is applied to the antenna to inductively couple energy to the process gas and produce a plasma in the chamber. A chief advantage of inductively coupled RF plasma reactors over other types of reactors, such as capacitively coupled reactors, is that a higher ion density can be achieved with the inductively coupled source.

To achieve effective plasma density at the workpiece, the distance from the workpiece to the antenna must be critically selected and is generally very small, e.g., less than 7.5 cm. As the distance is decreased in order to increase the plasma density near the workpiece surface, it is known in the art that the plasma ion density decreases at the workpiece center and ultimately, at very short workpiece to antenna distances, a center null is formed in the plasma that results in an unacceptable process non-uniformity. For example, in a plasma etch process accomplished in such a reactor, the etch rate at the center of a wafer may be so much less than elsewhere that it becomes impossible to perform a complete etch across the entire wafer surface without overetching near the wafer periphery. Conversely, it becomes impossible to avoid overetching at the wafer periphery without under etching the wafer center. Thus, the problem is to find a way of increasing the plasma ion density at the workpiece surface without decreasing the antenna to workpiece distance.

One solution is disclosed in U.S. Pat. No. 4,990,229 issued Feb. 5, 1991 and incorporated herein by reference. This patent discloses a high density plasma generator that utilizes a helical antenna that produces helicon waves to excite a plasma. The plasma is formed in a relatively small bell jar having an open end attached to an opening in the ceiling of a process chamber. The chamber is circumscribed with a plurality of permanent magnets that form a plasma confining magnetic field referred to as a "magnetic bucket". The chamber is typically a cylindrical enclosure having a top with the bell jar mounted centrally therein and a cylindrical side wall. A pedestal is mounted at the bottom of the chamber to support a workpiece, such as a semiconductor wafer, beneath the opening of the bell jar.

The bell jar, a non-conducting cylindrical chamber that is fabricated of quartz or Pyrex, is encircled by an antenna that is coaxially aligned with a center axis of the bell jar. The antenna is a pair of spaced apart loops that are electrically connected to one another such that RF current flows in an opposite direction through each loop. This combination of a bell jar and antenna forms a high density plasma source. The loop antenna is coupled to a 13.56 MHz RF source and, when energized, produces helicon waves having a "mode zero" (m=0) mode structure for the magnetic and electric fields within the bell jar. A process gas is supplied to the bell jar and infused with energy from the helicon waves to form a high density plasma.

Plasma control within the bell jar is provided by a plurality of electromagnets that circumscribe the exterior of the bell jar. The magnets form an axial magnetic field that transfers the plasma from the plasma source to the magnetic bucket.

To contain the plasma as it exits the bell jar and enters the bucket, the magnetic bucket is surrounded with strips of vertically oriented permanent magnets that extend along the cylindrical side walls of the bucket from the top to the bottom of the bucket. Each magnet is oppositely polarized from each adjacent magnet such that a magnetic field extending from one magnet to an adjacent magnet penetrates into the interior of the bucket by approximately a centimeter to confine the plasma in the bucket to a central region extending from the source to the workpiece.

To accelerate the plasma from the bell jar toward the workpiece, the pedestal is biased with an RF signal relative to ground. The chamber, including the side walls, top, and bottom are grounded. As such, the pedestal forms a cathode electrode and the chamber forms an anode electrode.

During, for example, plasma etching within this form of high density plasma reactor, the byproducts of the etch processes can become deposited upon many of the surfaces within the chamber including the side walls, top and bottom. Such deposition can change the electrical structure of the anode electrode such that the RF bias characteristics are altered. Such an alteration in the bias characteristics can change the plasma uniformity during wafer processing causing an unpredictable plasma fluctuation that can ruin wafers and cause anomalous etching. Additionally, such deposits on the walls and top of the chamber can create contaminants that flake and fall upon the wafer when the temperature of the process chamber changes during and after processing. Furthermore, such uncontrolled deposition can result in difficult cleaning that may lead to a build up of contaminants in the chamber over the life of the chamber resulting in shortened useful life of the chamber.

The bell jar and chamber are not generally cooled to any substantial degree. Usually a fan is provided to blow air over the bell jar. Such a fan is not sufficient to maintain the bell jar and chamber at a constant temperature during processing of a wafer and after processing a wafer. If the temperature of the chamber fluctuates by more than 10 degrees C., the material deposited on the walls of the chamber will flake and dislodge from the walls. Such particulates can contaminate the present wafer or those wafers that are subsequently processed in the chamber. Furthermore, temperature fluctuations of more than 10 degrees C. cause proportional fluctuations in process rates. Such process rate fluctuations are disadvantageous to wafer processes that are used to form semiconductor devices having line widths of less than 0.35 microns.

Therefore, there is a need in the art for a high density RF plasma reactor having improved plasma and thermal control that leads to improved wafer processing and contaminant performance.

SUMMARY OF THE INVENTION

The disadvantages of the prior art are overcome by a helicon wave, high density RF plasma reactor having a well defined anode electrode. More specifically, the invention is a plasma reactor having a reactor chamber with a top, bottom and at least one side wall. The top of the chamber supports a helicon wave, high density plasma source that produces a plasma using a mode zero (m=0) or mode one (m=1) resonant helicon wave. The plasma is axially confined within the chamber by a plurality of permanent magnets or solenoidal coils that circumscribe the chamber. The permanent magnets may be arranged as vertically oriented strips or horizontally oriented toroids that circumscribe the chamber. The magnetic field produced by these magnets confines the plasma to a central region of the chamber in what is referred to as a magnetic bucket.

To further control the plasma, a formal anode electrode defines a ground plane for the electric field in the chamber. In one embodiment of the invention, the anode is affixed to the top of the chamber and the pedestal is biased such that an electric field extends from the pedestal to the anode. To ensure that deposits from the plasma do not alter the anode electrode's electrical characteristics, the anode is heated to a temperature above the polymer condensation temperature. As such, the anode electrode remains clean throughout plasma processing and a well defined and consistent electric field is produced in the chamber between the pedestal and anode.

In a second embodiment of the invention, the top of the chamber is fabricated from a conductive or semiconductive material such that the top itself is used as the anode electrode. The top is electrically isolated from the side wall which is electrically floating with respect to ground. The top is heated to reduce deposition onto the anode ensuring that a consistent electric field is produced throughout wafer processing.

Another feature of the inventive reactor is a temperature control system mounted proximate the top of the chamber and the helicon wave source. The illustrative embodiment of a temperature control system that provides substantial heat removal characteristics uses a liquid vaporization cooling technique. The temperature control system comprises a vapor chamber that forms an enclosure adjoining the chamber top and the helicon wave source. A fluid distributor in the vapor chamber applies a substantially continuous fluid film over the chamber surface that vaporizes to form a vapor in the vapor chamber. The fluid vaporization controls the temperature of the chamber top and helicon wave source. Preferably, the fluid distributor comprises one or more sprayer nozzles for spraying a stream of fluid on the external surface of the chamber and source. Alternatively, the top of the chamber and the helicon wave source are temperature controlled using a cold plate affixed to the top and a cooling jacket circumscribing the bell jar. The cold plate and cooling jacket are provided a continuous flow of coolant to maintain a constant surface temperature for the bell jar and top of the chamber.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
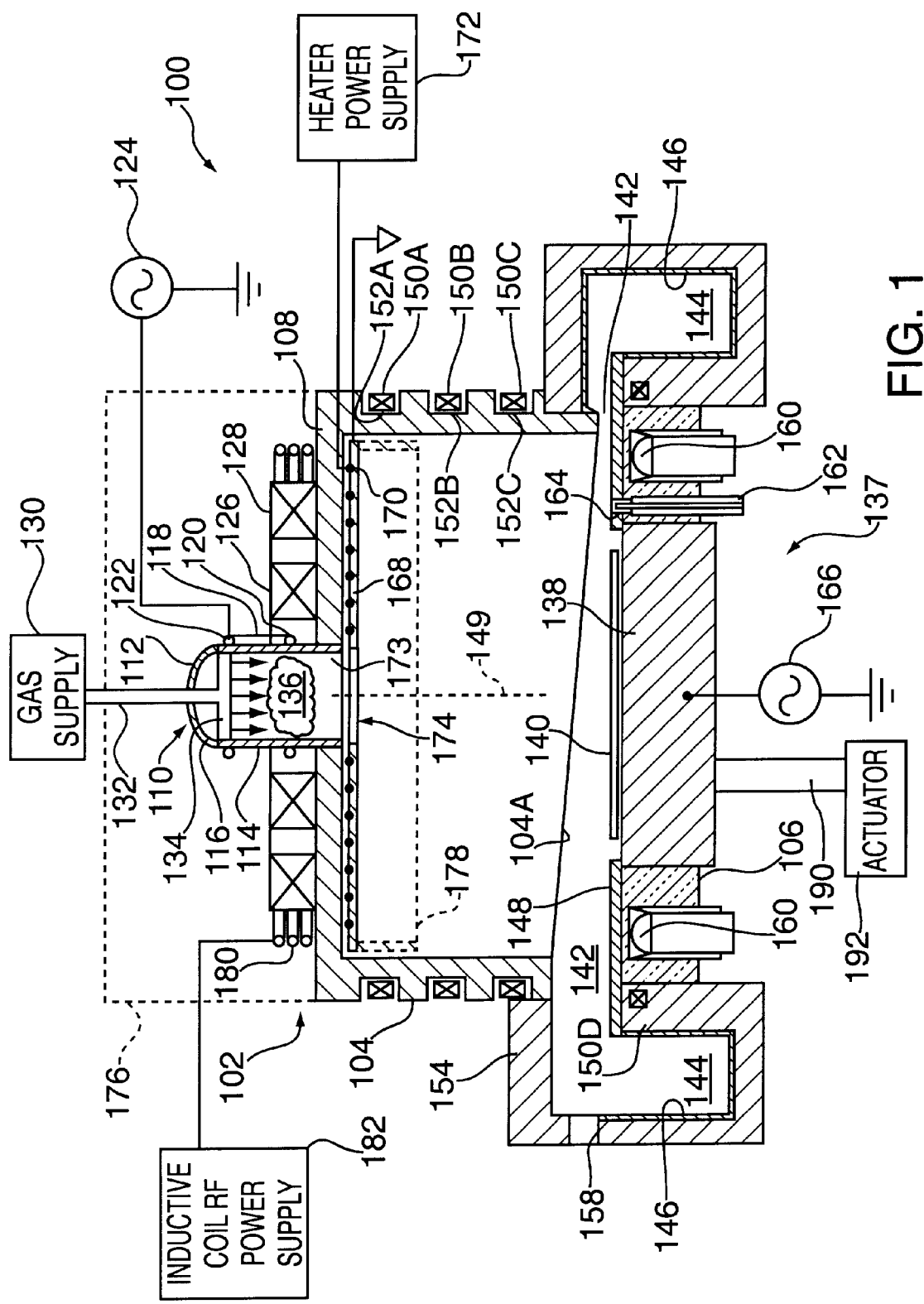
FIG. 1 depicts a cross sectional, schematic view of a high density RF plasma reactor of a first embodiment of the present invention.

FIG. 1 depicts a cross sectional, schematic view of a helicon wave, high density RF plasma reactor 100. The reactor 100 contains a process chamber 102 having a cylindrical side wall 104 and bottom 106 and, mounted centrally to a top 108 of the chamber 102, a high density plasma generator 110, i.e., a so-called helicon wave source. This source, as is described in more detail below, may operate using a mode zero helicon wave or a mode one helicon wave. When using a mode zero helicon wave the source is known as a mode zero resonant inductive (MØRI) source. MØRI is a trademark of Tricon Technologies, Inc. The helicon wave source 110 contains a high density plasma chamber 112 (a bell jar) having a cylindrical side wall 114 with a diameter of approximately 100 mm and a domed top 116. The bell jar is traditionally fabricated of a non-conductive material such as quartz, Pyrex or a ceramic material. Alternatively, the bell jar may be fabricated of semiconductive materials such as silicon carbide or silicon. An antenna 118 circumscribes the bell jar 112 and contains two, spaced apart circular loops 120 and 122 that are driven by an RF power supply 124 to establish a helicon resonant wave structure in the jar 112.

Figure 2:
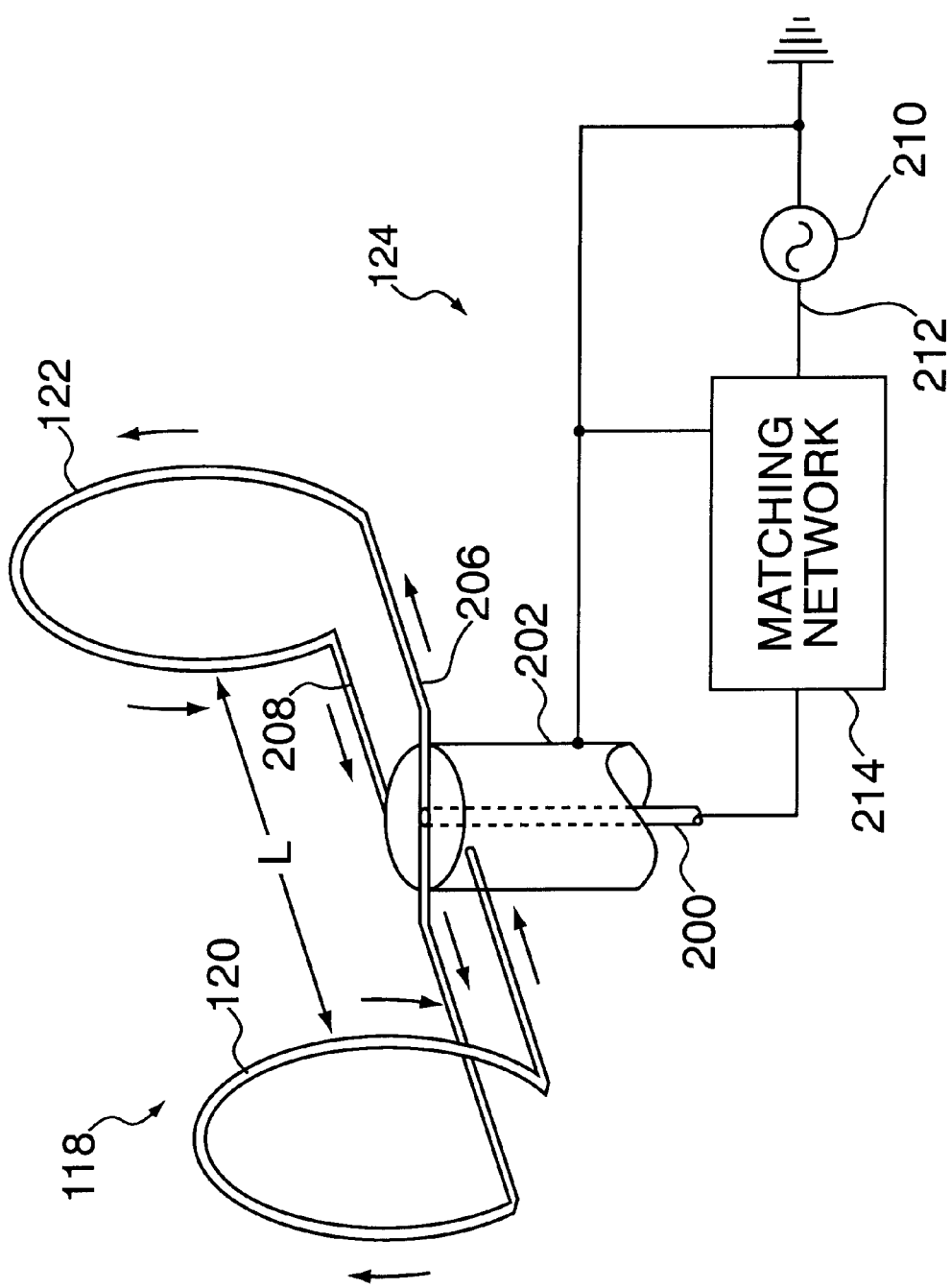
FIG. 2 depicts a schematic of a loop antenna structure capable of establishing a mode zero field structure in the plasma source of the plasma reactor of FIG. 1.

To best understand the helicon wave source operation, FIG. 2 depicts a schematic drawing of the antenna 118 and its drive electronics 124 that will produce a mode zero (m=0) helicon wave. RF current is made to flow through the two circular loops 120 and 122 in such a way that the current in one loop 120 is flowing in a clockwise manner, while the current in the other loop 122 is flowing in an anti-clockwise manner. This current flow is achieved by applying an RF voltage between an inner electrode 200 and an outer electrode 202 that is grounded and by using the conductors 206 and 208 to connect the two loops 120 and 122 to one another. The distance L between the loops 120 and 122 is adjusted to match the conditions in the plasma as dictated by the mode zero dispersion relation, $$[(w/w_c)w_p^2/c^2k_z^2]^2 = 1 + (3.83/k_z\alpha)^2.$$

where,
- w is the angular frequency of the resonant wave;
- $w_c$ is the cyclotron angular frequency;
- $w_p$ is the plasma frequency;
- k is the wave number;
- c is the speed of light; and
- $\alpha$ is a phase velocity parameter.

The RF power is supplied from the RF power supply 210 via a 50 ohm cable 212. The RF signal has a frequency of approximately 13.56 MHz and power in the range of 2 to 5 kW. The RF power is matched to the antenna using a matching network 214 that is tuned so that the loading of the antenna 118 is approximately 50 ohms in order to minimize the reflected power. The matching network can be any one of a number of available matching networks known in the art including a pi-network, a simple L-C circuit, a pair of capacitors, and the like.

As disclosed in U.S. Pat. No. 4,990,229, the antenna of the arrangement of FIG. 2 excites a mode zero helicon wave in the bell jar 112. Such a wave, when coupled to, for example, argon gas at 1.5 mTorr, produces a high density plasma of up to $1 \times 10^{13}$ ions/cm$^3$.

Other helicon wave producing antenna structures that are different from that depicted in FIG. 2 are known in the art and could be used to form mode zero or mode one in the bell jar. A variety of antenna structures are described in detail in U.S. Pat. Nos. 5,122,251 and 5,429,070, both of these patents are incorporated herein by reference.

Returning to FIG. 1, a process gas is supplied to the ell jar 112 from a gas supply 130. The gas supply is coupled to a gas manifold and distributor plate (a showerhead 134) via a conduit 132. The process gas may be coupled to the chamber through any location, e.g., top, bottom or side wall. The showerhead 134 provides a dispersed process gas flow pattern into the bell jar 112. The RF energy supplied by the antenna 118 ignites the process gas into a plasma 136.

As the plasma 136 is formed, the plasma is propelled from the bell jar 112 by a magnetic field produced using a pair of annular magnetic field coils 126 and 128. These coils circumscribe the bell jar 112 and are coaxial with the central axis 149 of the bell jar 112, where coil 126 is the inner coil having dimensions of approximately a 7 inch inner diameter and a 9.83 inch outer diameter. The coil 128 is the outer coil having dimensions of approximately a 11.6 inch inner diameter and a 12.84 inch outer diameter. DC current flows in opposite direction in the inner and outer coils and the current values are generally different in each coil. For example, the inner coil 126 may carry 100 A flowing in a clockwise direction and the outer coil 128 may carry 60 A flowing in a counter-clockwise direction. The ratio of the inner coil current to the outer coil current is in the range of 1.0 to 2.5. When driven in this manner, the coils 126 and 128 create an axial magnetic field that urges the plasma 136 from the bell jar 112 toward the wafer 140.

The chamber 102 is defined by a cylindrical side wall 104, a circular top 108 and a bottom 106. The side wall 104 and the top 108 are integrally formed so that the side wall 104 and the top 108 constitute a single piece of material, such as silicon, aluminum or other materials. However, the invention may be accomplished with a side wall and top formed of separate pieces, as will be described below with reference to FIG. 5.

The bottom 106 of the chamber 102 supports a pedestal assembly 137 having a biasable pedestal base 138 (i.e., a cathode electrode). The pedestal base 138 generally supports a workpiece, such as a semiconductor wafer 140, within the chamber 102 in a workpiece support plane during processing. To retain the wafer in a stationary position, the pedestal base 138 may support an electrostatic chuck or a clamp ring mechanism (for simplicity neither a chuck nor a clamp ring is shown). Additionally, the pedestal base may contain wafer heating and/or cooling hardware (not shown) as well as a process gas feed conduit (not shown). Furthermore, the pedestal assembly 137 may be supported by a shaft 190 that is coupled to an actuator 192. The actuator 192 vertically positions the pedestal assembly 137 relative to the helicon wave source 110. As such, the distance between the source 110 and the wafer can be controlled to optimize wafer exposure to the plasma and wafer processing. Additionally, the actuator 192 lowers the pedestal base to a position below the process region of the chamber 102 that enables the wafer to be retrieved from (or placed upon) the pedestal base by a wafer transport robot (not shown).

The process chamber 102 and bell jar 112 are evacuated by a pump (not shown in the drawing) through an annular passage 142 to a pumping annulus 144 surrounding the lower portion of the chamber 102. The interior of the pumping annulus 144 may be lined with a replaceable metal liner 146. The annular passage 142 is defined by the bottom edge 104A of the cylindrical side wall 104 and a planar ring 148 surrounding the pedestal assembly 137 and supported by the bottom 106 of the chamber 102. A wafer slit valve 158 extends through the exterior wall of the pumping annulus 144 accommodates wafer ingress and egress. The annular passage 142 between the side wall 104 and the pumping annulus 144 is larger adjacent the wafer slit valve 158 and smallest on the opposite side by virtue of a slant of the bottom edge 104A of the side wall 104 so as to make the chamber pressure distribution more symmetrical with a non-symmetrical pump port location.

To ensure that the plasma does not contact any contaminant producing materials, such a metal, in the exhaust passage 142 or annulus 144, plasma confinement magnets 150C and 150D (permanent magnets having a toroidal shape) are located adjacent the annular passage 142. These magnets 150C and 150D produce a magnetic field that reduces plasma flow into the pumping annulus 144, i.e., charged particles are repelled from the passage 142. To the extent any polymer precursor and/or active species succeeds in entering the pumping annulus 144, any resulting polymer or contaminant deposits on the replaceable interior liner 146 may be prevented from reentering the chamber 102 by maintaining the liner 146 at a temperature significantly below the polymer condensation temperature.

The side wall 104 and top 108 of the chamber 102 are illustratively fabricated of a semiconducting material such as silicon. The bottom 106 is an insulative material such as quartz. The chamber side wall 104 may also be fabricated of silicon carbide, silicon dioxide (quartz), silicon nitride, or a ceramic as well as a metal such as aluminum.

If the side wall 104 and/or top 108 are formed of silicon, the silicon will likely be a source of a fluorine scavenger material. To avoid consuming the chamber 102, a disposable silicon member can be placed inside the chamber 102 and maintained as a sufficiently high temperature to prevent polymer condensation thereon and permit silicon material to be removed therefrom into the plasma as fluorine scavenging material. In this case, the side wall 104 and top 108 need not necessarily be silicon, or if they are silicon they may be maintained at a temperature near of below the polymer condensation temperature so that they are coated with etch byproduct polymers and protected from being consumed. While the disposable silicon member may take any form, in the embodiment of FIG. 1, the disposable silicon member is the annular ring 148 surrounding the pedestal assembly 137. Preferably, the annular ring 148 is a high purity silicon and may be doped to alter its electrical or optical properties. In order to maintain the silicon ring 148 at a sufficient temperature to ensure its favorable participation in the plasma process (e.g., its contribution of silicon material into the plasma for fluorine scavenging), plural radiant heaters 160 (e.g., tungsten halogen lamps) arranged in a circle under the annular ring 148 heat the silicon ring 148 through a quartz window 106 (bucket bottom). The heaters are controlled in accordance with the measured temperature of the silicon ring 148 sensed by temperature sensor 162 which may be a remote sensor such as an optical pyrometer or a fluoro-optical probe. The sensor 162 may extend partially into a very deep hole 164 in the ring 148, the depth and narrowness of the hole tending at least partially to mask temperature dependent variations in thermal emissivity of the silicon ring 148, so that it behaves more like a gray-body radiator for more reliable temperature measurement.

The plasma 136, once propelled into the chamber 102 from the helicon wave source 110, is preferably confined to the axial center (along axis 149) of the chamber 102 such that the wafer 140 is exposed to a high ion density. Magnetic confinement is provided by a plurality of toroidal, permanent magnets 150A, 150B, 150C, and 150D. Optionally, these permanent magnets may be replaced with solenoidal electromagnets. These magnets form magnetic fields that extend from each magnet to its adjacent neighbor. A comprehensive summary of the magnetic confinement is provided below with respect to FIG. 4. Each toroid 150A, 150B, 150C and 150D is positioned in a respective annular channel 152A, 152B, 152C that circumscribes the side wall 104 of the chamber 102. Together the magnetic fields from the magnets 150A, 150B, 150C and 150D define a magnetic bucket that confines the plasma to the axial center of the chamber 102.

To further define the plasma, the pedestal base 138 is biased with an RF signal. The RF signal is produced by RF source 166 at a frequency of approximately 2 MHz and a power level of up to 3 kW. To produce a well defined electric field to control the plasma distribution within the magnetic bucket, an anode electrode 168 is provided and the chamber side wall 104 and top 108 are floating with respect to ground. The anode electrode is a ring with an opening 174 that is coaxial with the open end 173 of the bell jar 112. The anode electrode is affixed, for example, by screws to the top 108 of the chamber 102. The anode electrode 168 is fabricated from a conductive or semiconductive material and is grounded. For example, the anode electrode 168 may be fabricated of silicon, silicon carbide, or other conductive materials.

To maintain a clean anode electrode, the electrode is heated above the polymer condensation temperature, e.g., 250 degrees C. maximum. Such heating can be provided by a resistive heater 170 affixed to the back of the anode electrode 168 or by a plurality of tungsten halogen lamps (not shown). The heater 170 is coupled to a heater power supply 172 that supplies current to the resistive heater. In this manner, the anode electrode 168 provides a consistent ground path for the electric field.

If the anode electrode 168 is fabricated of silicon, it may also be used as a source of silicon for fluorine scavenging. As such, the ring 148 and its heaters 160 may not be necessary. The anode then becomes a disposable and consumable component of the chamber 102.

Since the area ratio of the anode to cathode is very important to etch processes, the anode size can be optionally extended using a cylindrical extension 178. The extension 178 is integrally formed with the ring portion 168 of the anode such that the anode is cup-shaped. The entire interior surface of the cup-shaped anode defines the anode area. As such, the extension 178 can be fabricated to produce an anode to cathode ratio that fulfills a given process requirement. Additionally, the anode can be interchanged with another anode have a different area to alter chamber process characteristics as required.

Figure 3A:
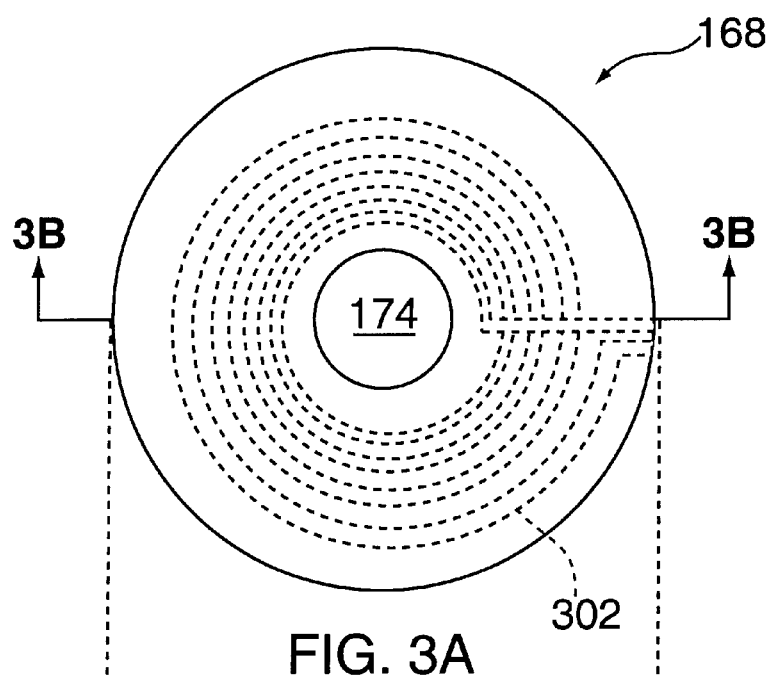
FIG. 3A depicts a top plan view of an anode electrode of the plasma reactor of FIG. 1.
Figure 3B:
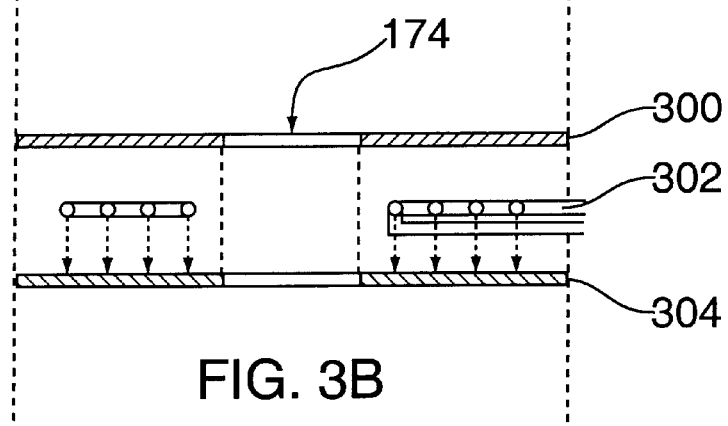
FIG. 3B depicts an exploded cross sectional view of the anode electrode of FIG. 3A.
Figure 3C:
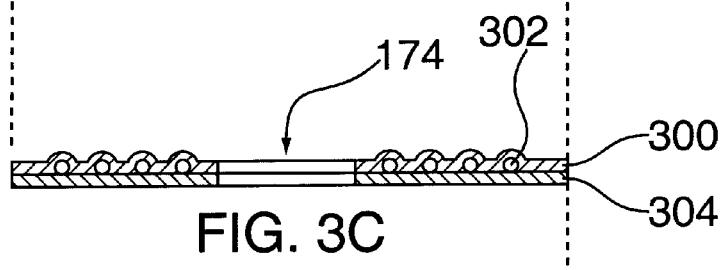
FIG. 3C depicts an assembled cross sectional view of the anode electrode of FIG. 3A and 3B.

FIG. 3A depicts a top plan view of one embodiment of the anode electrode 168; FIG. 3B depicts an exploded cross sectional view of the anode electrode 168 of FIG. 3A taken along line 3B—3B; and FIG. 3C depicts an assembled cross sectional view of the anode electrode of FIG. 3A. To best understand this embodiment of the anode electrode 168, the reader should simultaneously refer to FIG. 3A, 3B, and 3C.

Specifically, the anode electrode 168 is a ring having a central opening 174. The electrode is fabricated from a laminate of two layers 300 and 304 of conductive material, e.g., silicon or silicon carbide, having a resistive heater coil 302 disposed therebetween. Layers 300 and 304 are affixed to one another by diffusion bonding. The resistive heat 302 is fabricated of tungsten coil.

Returning to FIG. 1, to enhance the high density plasma once it has entered the chamber 102, one or more inductive coils 180 may be used to couple further RF energy into the plasma. Such optional coils 180 are driven by an inductive coil RF power supply 182 having a frequency of approximately 13.56 Mhz and a power level of approximately 2 KW. To reduce the amount of surface area used by the coil 180, each coil is in the form of a solenoid having coil turns and stacked one atop another vertically from the upper surface of the chamber top 108. Furthermore, each coil 180 has a diameter that is slightly larger that the outer coil 128 of the plasma source 110.

Figure 4:
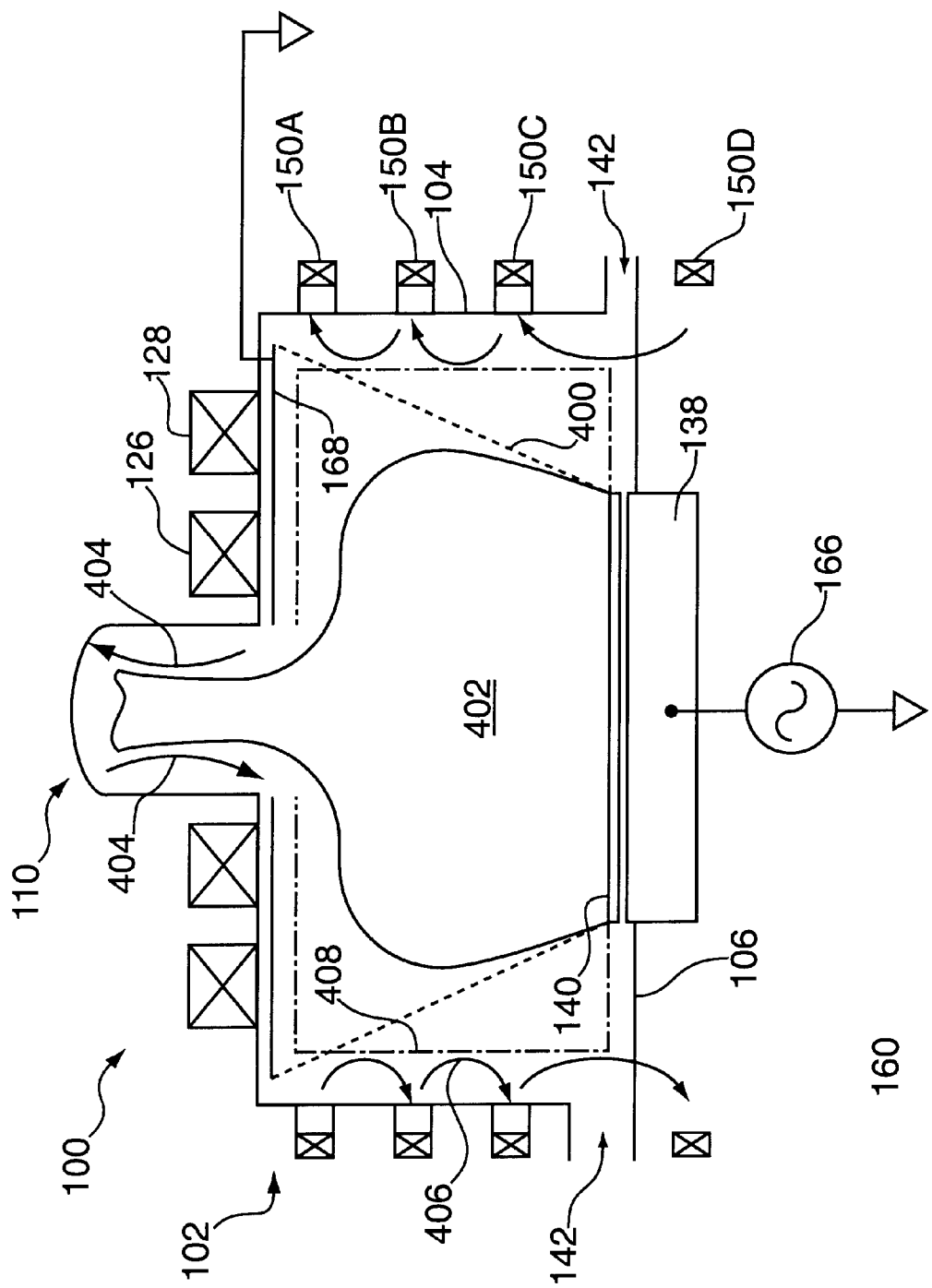
FIG. 4 depicts a cross sectional schematic view of the magnetic fields produced by various magnetic components of the chamber to control the plasma.

FIG. 4 depicts a schematic view of magnetic and electric fields that define a magnetic bucket (shown as dashed line 408) within the reactor 100 of FIG. 1. The plasma 402 is formed in the helicon wave source 110 as described above. The inner 126 and outer 128 axial field coils generate a magnetic field 404 that propels the plasma 402 from the source 110 into the chamber 102. The plasma expands in the magnetic bucket 408 and would fill the chamber 102 if not confined toward the center. Such confinement is accomplished using magnetic fields 406 produced by the toroidal magnets 150A, 150B, 150C, and 150D as well as an electric field 400 between the anode electrode 168 and the cathode electrode 138. The magnetic field 406 penetrates the side wall 104 of the chamber 102 by approximately one to two centimeters. This penetration is enough to keep the plasma from contacting the side wall 104 and/or consuming side wall material. In addition, as described above, the bottom most magnets 150C and 150D also reduce plasma flow into the pumping annulus 142. Note that the side wall magnetic field 406 extends below the plane of the substrate to ensure that the plasma 402 remains confined from top to bottom of the chamber 102.

The electric field 400 accelerates the plasma 402 toward the wafer 140 by biasing the wafer relative to the plasma potential. As such, a substantial amount of charged articles will follow the electric field lines of force toward the wafer 140. To achieve stable lines of force in the chamber 102, a grounded anode electrode 168 is used. As such, deposition of polymers and other materials upon the surfaces of the chamber will not effect the ground plane definition and, consequently, such deposition does not effect the electric field.

Figure 5:
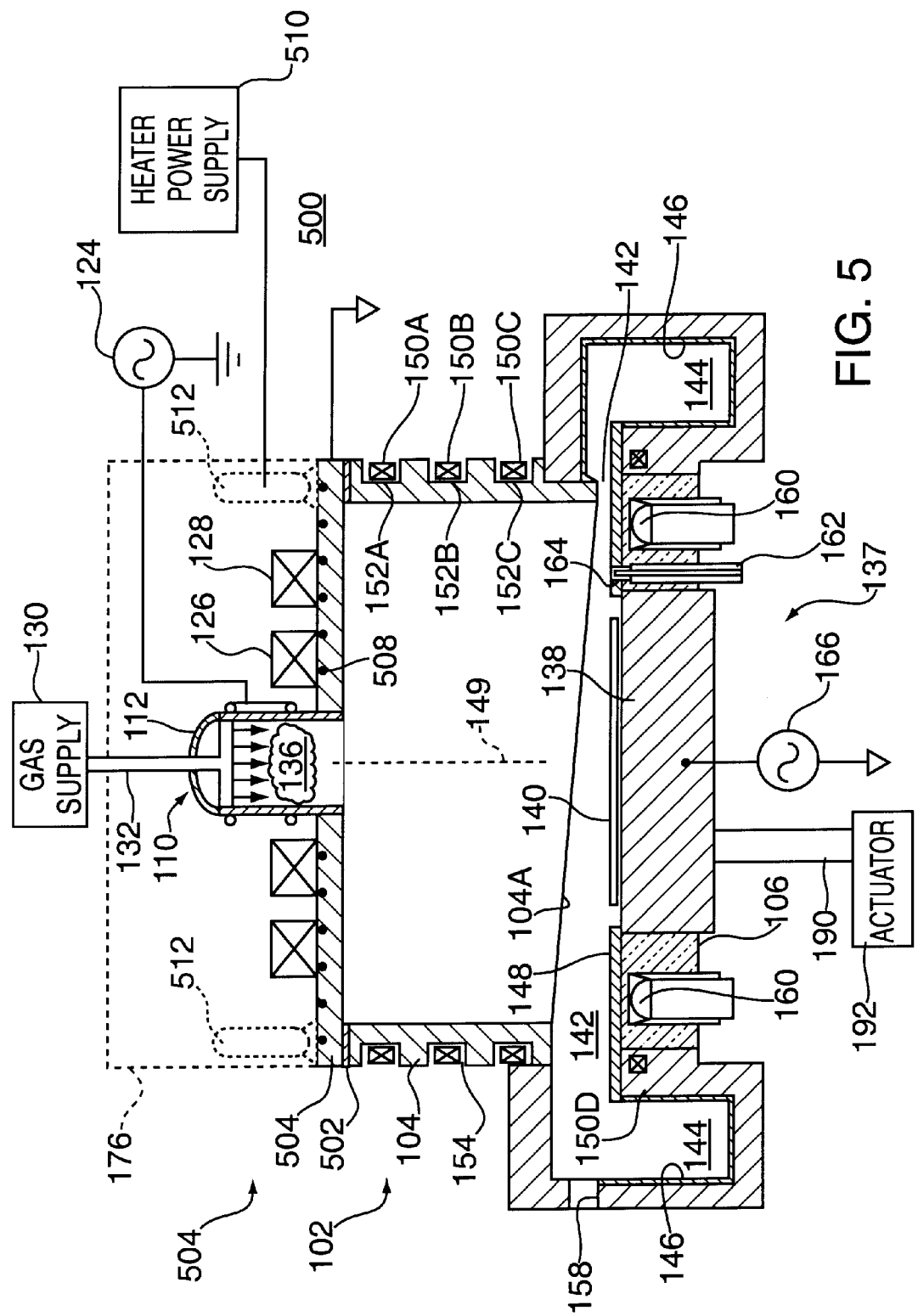
FIG. 5 depicts a cross sectional, schematic view of a second embodiment of the high density plasma reactor of the present invention.

FIG. 5 depicts a schematic cross sectional view of a second embodiment of a helicon wave, high density plasma reactor 500 of the present invention. In this second embodiment, the top 504 and the side wall 506 are fabricated as two separate components. The top 504 is fabricated from a conductive or semiconductive material such as silicon or silicon carbide. The side wall 506 is fabricated from any material that is permeable to the magnetic fields of magnets 150A, 150B, 150C and 150D. However, if the material of the side wall 506 is conductive or semiconductive, an insulator ring 502 is used to isolate the top 504 from the side wall 506. Such an insulator ring may be fabricated of alumina or other insulative materials. Although the top 504 and bell jar 112 are depicted as two pieces, they may be formed as one piece fabricated from a common material, e.g., silicon or silicon carbide.

In this second embodiment, the top 504 forms the anode electrode and is coupled to ground. The side wall 104 is electrically floating with respect to ground. The top 504 is heated to a temperature above the polymer condensation temperature such that the top remains clean during wafer processing. A clean top surface ensures that a well defined electric field will be generated throughout plasma processing of the wafer. As in the previous embodiment, a resistive heater 508 is used to heat the top 504. The resistive heater coil is either imbedded in the top material or is affixed to the outside surface of the top 504. The heater 508 is coupled to and driven by a current from a heater power supply 510. Alternatively, an array of heating lamps 512 can be mounted to the top 504 to supply heat to the top. The lamps can be illustratively positioned in a circle about the outer edge of the top 504. As with the first embodiment of the invention, the anode in this second embodiment can be extended to form a larger anode area. As such, the anode can be extended partially along the side wall 104 of the chamber such that the anode forms the top as well as a portion of the side wall.

A thermal control assembly 176 is adjoined to the top 504 to maintain the top 504 and the bell jar 112 at a relatively constant temperature. Various embodiments of a thermal control assembly are described with reference to FIGS. 6 and 7 below.

Figure 8A:
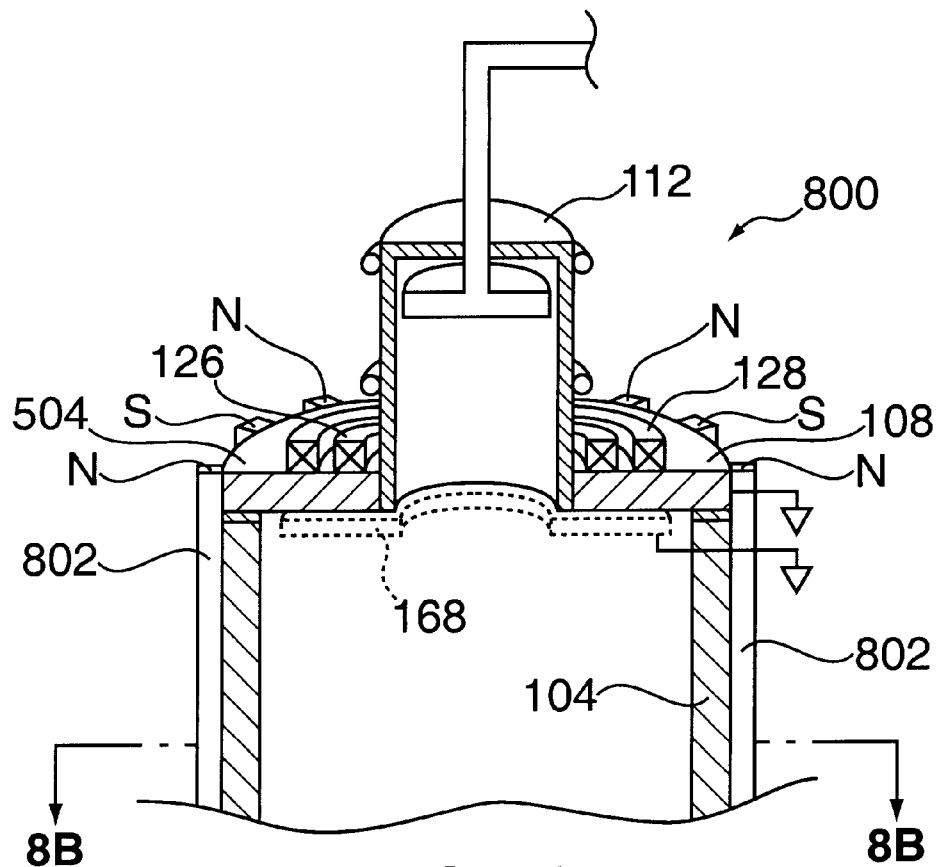
FIG. 8A depicts a perspective, cross sectional view of an embodiment of the invention having a vertically oriented magnets to define a magnetic bucket.
Figure 8B:
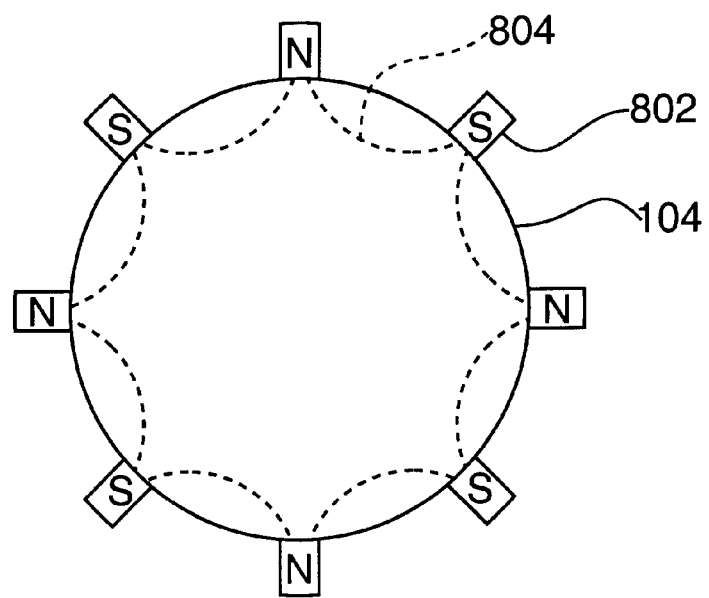
FIG. 8B depicts a top, cross sectional view of the reactor of FIG. 8A taken along line 8B—8B of FIG. 8A.

FIG. 8A depicts a schematic, cross-sectional side view of a third embodiment of the present invention and FIG. 8B depicts a cross sectional top view of the third embodiment taken along line 8B—8B of FIG. 8A. In this embodiment, the defined ground plane 168 or 504 (i.e., the formal anode) of either of the first or second embodiments is used in conjunction with a plurality of vertically oriented permanent magnets 802. Such an arrangement of magnets to form a magnetic field to control the plasma in the bucket is disclosed in U.S. Pat. No. 5,421,891, which is incorporated herein by reference. The permanent magnets 802 are arranged with their poles perpendicular to the wall of the chamber 102 and with alternating north (N) and south (S) poles. With this arrangement, the magnetic field lines 804 follow a multi-cusp pattern. The magnetic field pattern maintains the plasma near the center of the chamber 102 and away from the wall 104.

Returning to FIG. 1, the temperature control assembly 176 according to the present invention is capable of maintaining uniform and constant temperatures across a surface of the top 108 and bell jar 112 for changing thermal loads and temperature fluctuations inside the chamber 102. The temperature control assembly 176 is particularly advantageous for controlling the temperature of a convoluted external surface of a process chamber that has a complex three-dimensional relief structure. The temperature control assembly 176 of the present invention maintains a constant and uniform temperature across the top 108, reduces the mechanical and thermal stresses on the top 108 and bell jar 112, and provides consistent substrate processing rates. To decrease the amount of polymer accumulation of the chamber walls, one or more heating elements, e.g., heat tape, can be applied to the outer surface of the chamber. The elevated temperature of the walls will avoid polymer condensation on the walls.

Figure 6:
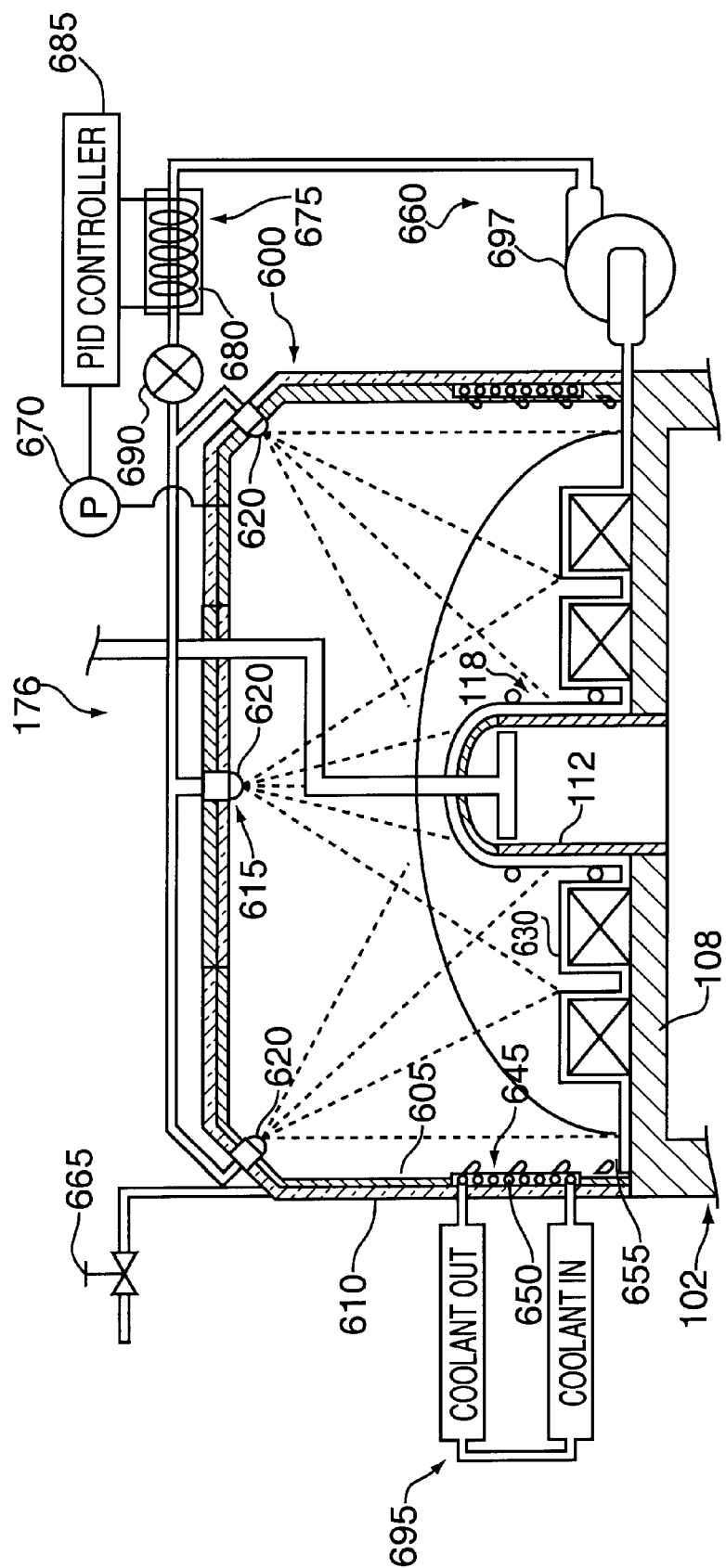
FIG. 6 depicts a cross sectional, schematic view of an illustrative temperature control assembly for the high density plasma reactor of FIGS. 1 or 5.

FIG. 6 depicts a cross sectional view of an illustrative temperature control assembly 176 that uses a liquid vaporization technique to cool the top 108 and bell jar 112. The top 108 of the chamber 102 forms a complex shaped surface whose temperature is regulated by the temperature control assembly 176. The top 108 can be flat or rectangular shaped, arcuate, conical, or dome-shaped, and in one version comprises a substantially flat surface that supports the bell jar 112 and supports the axial magnetic field coils 126 and 128.

The temperature control assembly 176 comprises an enclosure vapor chamber 600 that adjoins or surrounds at least a portion of the chamber top 108. The vapor chamber 600 provides a gas tight barrier for controlling the partial and absolute pressure of vapor and/or gas contained in the vapor chamber. Preferably, the vapor chamber 600 comprises an inner metal wall 605 at least partially enclosed by an outer thermal insulator layer 610 to steady state temperatures in the vapor chamber 600.

A fluid distributor 615 in the vapor chamber 600 applies fluid to the top 108 to control the temperature of its surface. Preferably, the fluid distributor 615 comprises one or more nozzles 620 arranged to apply a continuous film 630 over at least a portion of the chamber surface. The fluid covers substantially the entire top 108 in the vapor chamber uniformly and continuously to prevent formation of localized hot spots that would otherwise arise at areas where the entire fluid film 630 has vaporized due to a higher localized heat load. More preferably, the fluid distributor applies the fluid film 630 sufficiently thin to reduce any temperature differences that occur through the thickness of the fluid film 630. The nozzles of the fluid distributor are preferably sprayer nozzles 620 that spray fluid on the top 108.

As the fluid film 630 on the chamber surface vaporizes, i.e., changes in phase from a liquid phase to a vapor phase, it removes a predictable quantum of heat that is proportional to the specific heat of vaporization of the fluid. As the heat load in the chamber 102 and bell jar 112 increases, the added heat is removed by increased vaporization from the fluid film 630 without change in the temperature of the top 108 or bell jar 112. To maintain the fluid film 630 on the top 108 and bell jar 112, the fluid distributor 615 disperses fluid at a rate that is greater than the rate of vaporization from the fluid film 630. Furthermore, the vaporization temperature of the fluid, and consequently the temperature of the top 108, can be controlled by adjusting either the total pressure in the vapor chamber 600, or the partial pressure of the vapor relative to the total pressure.

Preferably, the fluid film 630 comprises a fluid dielectric material having a thickness and an electrical field absorption at radio frequencies that is sufficiently low to allow the RF induction field generated by the antenna 118 adjacent to the bell jar 112 to permeate or pass through the fluid film on the jar's surface with substantially no attenuation or loss of energy. Suitable low dielectric constant fluids, include perfluorinated liquids such as GALDEN®, commercially available from Ausimont U.S.A. Inc., New Jersey, or FLUORINERT®, commercially available from the 3M Corporation, Minnesota.

More preferably, the fluid comprises a liquid having a low surface tension relative to the top 108 and bell jar 112, that spreads uniformly across the top 108 as well as the other components of the plasma source 110 and temperature control assembly 176, and chemically stable over a wide temperature range. The fluid should also have a low specific heat capacity $C_p$ to provide higher sensitivity to temperature fluctuations of the top 108. When the fluid has a low $C_p$, even a small change in the temperature of the top 108 or bell jar 112 will immediately cause increased vaporization of the fluid, thereby lowering the temperature of the surface. Preferably, the fluid has a specific heat capacity $C_p$ of less than about 0.5 cal/g, and more preferably less than about 0.25 cal/g.

In the embodiment shown in FIG. 6, the fluid distributor 615 comprise sprayer nozzles 620 positioned above the top 108 and bell jar 112 to spray fluid onto the chamber surface to form the fluid film 630. The sprayer nozzles 620 are spaced apart and oriented to cover substantially the entire top 108 and bell jar 112 in the vapor chamber with a fluid spray that forms a continuous fluid film 630 having a uniform thickness, even on complex shaped or convoluted surfaces. By continuous fluid film is meant a fluid film that is not excessively patchy or that covers only selected sections of the top 108. To reduce the height of the vapor chamber 600 each sprayer nozzle 620 provides a cone of fine mist with wide radial coverage at a small height above the top 108. In a preferred version, the sprayer nozzles 620 spray a cone-shaped fog of atomized fluid at an angle of from about 150° to about 45°, and at an elevation of less than about 30 cm above the top 108. In an even more preferred embodiment, the fluid distributor 615 comprises sprayer nozzles 620 that have few moving parts and are easy to maintain.

The vapor formed in the vapor chamber 600 by the vaporization of the fluid film 630 on the top 108 is condensed on an inner surface of the inner wall 605 of the vapor chamber 600, releasing heat removed from the chamber surface at a distal location. Preferably, the vapor chamber 600 comprises a condenser 645 having coolant channels 650 holding conventional condenser coolant for cooling and condensing the vaporized fluid to form condensate. The coolant is provided by a heat exchanger 695. The condenser coolant is filtered and maintained at a neutral pH to reduce erosion or corrosion in the coolant channels 650. More preferably, the coolant channels 650 are recessed in the inner wall 605 of the vapor chamber 600 to reduce the thickness of material between the coolant channels and the inner surface of the inner wall to provide higher heat transfer rates. The vapor chamber 600 further comprises an annular reservoir 655, located beneath the condenser 645, for collecting the condensate to supply fluid to a recirculating system 660 that filters and pumps (using pump 697) the fluid from the reservoir 655 to the fluid distributor 615.

In operation, a plasma formed in the bell jar 112 heats the jar 112 and top 108 and causes a portion of the fluid film 630 to vaporize to form vapor in the vapor chamber 600. An optional vent valve 665 in the vapor chamber 600 can be opened to release the air or other gases in the vapor chamber, to adjust the partial pressure of vapor in the vapor chamber and thereby change the vaporization temperature of the fluid on the top 108 and bell jar 112. Thus a desired equilibrium temperature of the fluid on the top 108 is set by varying the total pressure of vapor or the ratio of vapor to air in the vapor chamber 600. This is accomplished by opening the vent valve 665 while fluid is being sprayed into the vapor chamber 600 to vent to the atmosphere a fraction of the air or gas in the vapor chamber 600. Generally, as the ratio of the partial pressure of the vapor to air in the vapor chamber 600 increases the vaporization temperature of the fluid film 630 also increases proportionately. Thus, opening the vent valve 665 increases the partial pressure of vaporized fluid in the vapor chamber 600, and the vaporization temperature of the fluid film 630. Conversely, not opening the vent valve 665 allows the partial pressure of vaporized fluid in the vapor chamber 600, and consequently the vaporization temperature of the fluid film 630, to stabilize at a lower equilibrium value. Therefore, the equilibrium temperature of the top 108 can be adjusted by varying the duration and aperture of the vent valve 665. The vent valve 665 can be any type of valve that can be manually or remotely actuated by mechanical, electronic, or pneumatic means. For example, a suitable remotely actuated vent valve 665 comprises a motor-operated globe valve that has multiple different apertures that provide varying flow rates.

In an alternative embodiment, the vapor pressure of the vapor in the vapor chamber 600 can be adjusted by introducing a premixed ratio of fluid and gas into the vapor chamber (not shown). The gas is preferably a non-reactive gas such as $N_2$ or Ar. A computer program (as described below) is used to control the volumetric fraction of vapor to gas to achieve the desired vaporization temperature of the fluid/gas mixture applied to the top 108.

A pressure sensor 670, such as for example manometer, that measures the pressure in the vapor chamber 600. The pressure sensor 670 and a temperature regulator 675 that heats or cools the fluid as necessary to maintain a predetermined vapor chamber 600 pressure cooperate to provide a closed loop temperature control assembly 176. Preferably, the temperature regulator 675 comprises an in-line heater 680 that heats the fluid while it is in the recirculating system 660 to a temperature close to its vaporization temperature. The heater 680 is controlled by a proportional integral-derivative (PID) controller 685 and the flow of heated fluid is controlled by regulator 690. The heated fluid provides more sensitive control of the temperature of the top 108 and a more rapid response to its temperature fluctuations because only a small quantum of heat is needed to vaporize the fluid film 630 that is already close to its vaporization point. The pressure of the vapor continues to increase as the fluid film 630 on the top 108 continues to vaporize. The pressure sensor 670 senses the increased pressure in the vapor chamber 600 and proportionately lowers the operating temperature of the heater of the temperature regulator 675 through heater current adjustment facilitated by the PID controller 685. Eventually, an equilibrium condition is reached at which the absolute pressure in the vapor chamber 600 is equal to a predetermined set-point pressure. The two-phase environment in the vapor chamber 600 now operates a self-regulating temperature controller. As the heat load in the process chamber increases, more fluid vaporizes to increase the vapor pressure in the vapor chamber 600. The increased vapor pressure is sensed by the pressure sensor 670 and the operating temperature of the temperature regulator 675 is lowered to provide a cooler fluid that is sprayed through the fluid distributor 615 to cool or remove more heat from the top 108.

In an even more preferred embodiment, the temperature regulator 675 comprises a flat heater 685. The flat heater is preferred because it comprises an internal grid having a large heated surface area that heats the fluid at a low heat rate as the fluid flows past the grid surface. Also, because flat heater conforms to many surfaces of the processing apparatus and temperature control assembly 176, it can be mounted to reduce the overall footprint of the apparatus. Also, typically, the fluid can tolerate heaters that apply only up to about 20 W/in² at flow rates used in the present invention, and more rapid heating causes the low RF absorption properties of the fluid to deteriorate. The large surface are of the internal grid allows the flat heater to apply a total of over 4000 watts to heat the fluid at a rate of less than about 20 W/in².

Figure 7:
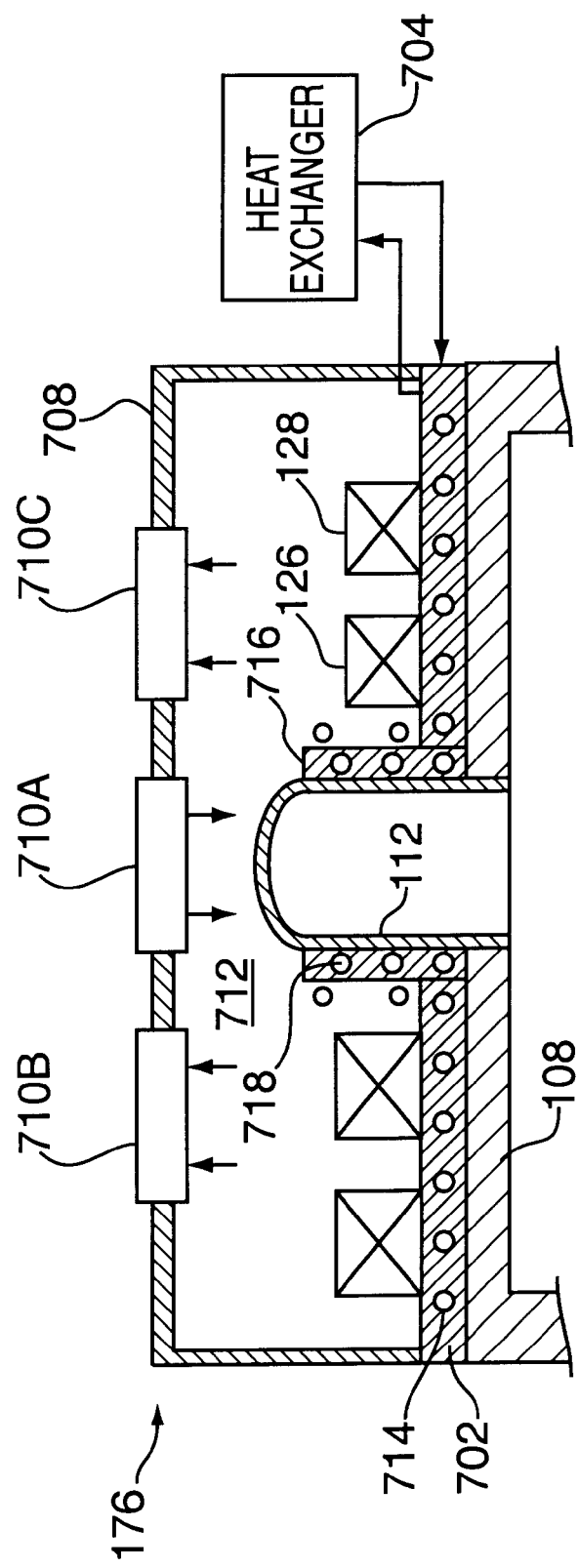
FIG. 7 depicts a cross sectional, schematic view of another illustrative temperature control assembly for the high density plasma reactor of FIGS. 1 and 5.

FIG. 7 depicts an alternative embodiment of the temperature control assembly 176. This embodiment comprises a cooling plate 702, a heat exchanger 704, an enclosure 706 and a plurality of fans 710. The cooling plate 702 is fabricated of a material having a high thermal conductivity such as copper or aluminum. The cooling plate 702 contains a plurality of channels 714 that allow a heat transfer fluid such as water or glycol to flow from a heat exchanger 704. Further cooling is provided by a plurality of fans 710 mounted to the top of an enclosure 708. The enclosure defines a volume 712 into which the air is blown by the central fan 710A. Other fans represented by outer fans 710B and 710C pull air from the enclosure volume 712. As such, an air flow pattern is produced that removes heat from the bell jar 112.

To temperature control the bell jar 112 (if necessary), a cooling jacket 716 circumscribes the jar 112. This jacket 716 is fabricated from an RF permeable material or an air chamber that also provides sufficient thermal conductivity. The jacket 716 contains a plurality of conduits 718 that allow coolant to flow from the heat exchanger 704. To provide a comprehensive temperature control assembly, both the cooling plate 702 and the cooling jacket 716 are used to control the temperature of the bell jar 112 and top 108. To provide independent temperature control of the jar 112 and top 108, the cooling plate 702 and the cooling jacket 716 may be coupled to separate heat exchangers.

Figure 9:
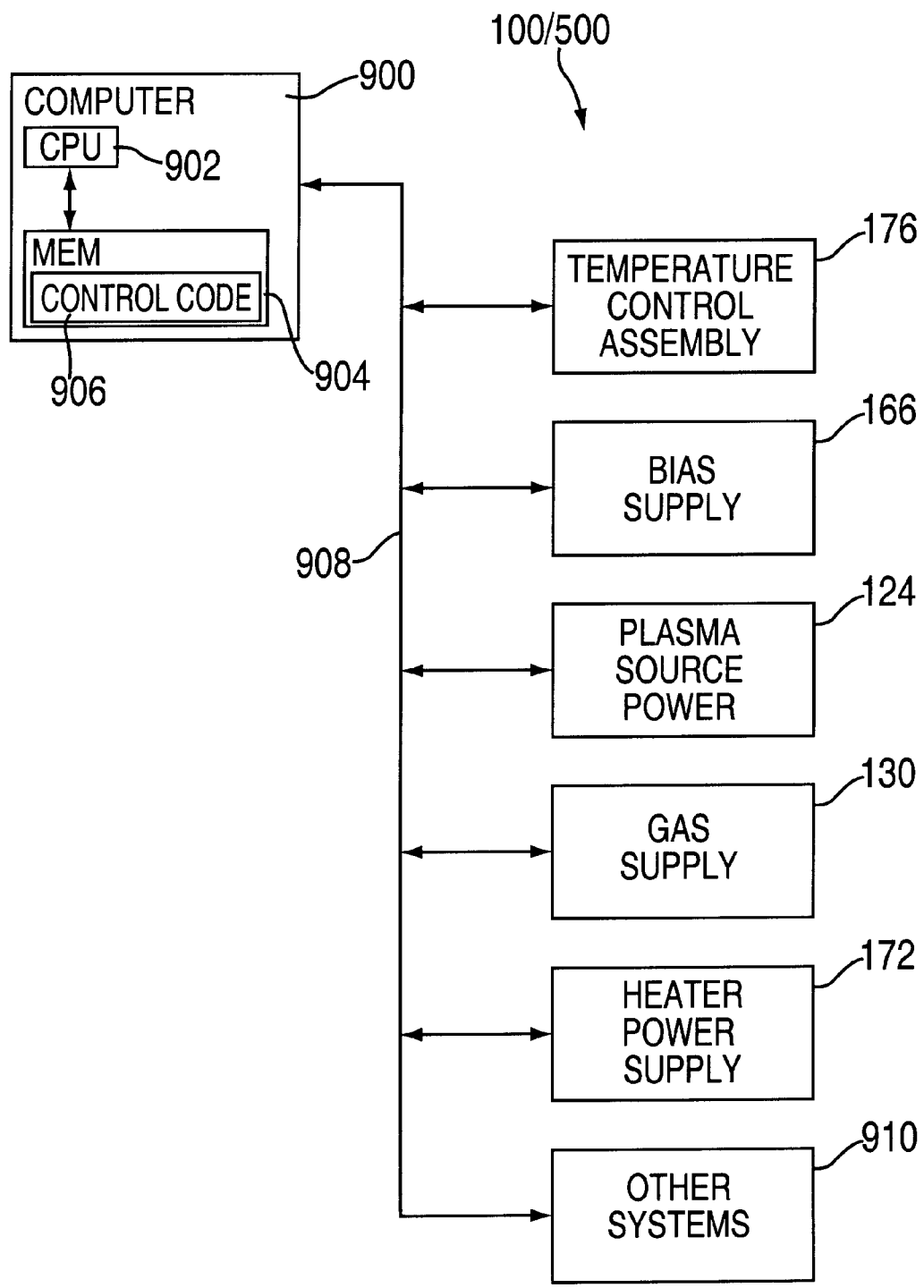
FIG. 9 depicts a functional block diagram of a computer system that controls the operation of the present invention.

FIG. 9 depicts a functional block diagram of the computer system 900 that controls the operation of the reactor 100 or 500. The computer system 900 comprises a central processor unit (CPU) 902 interconnected to a memory 904 system with peripheral control components, such as for example, a PENTIUM microprocessor, commercially available from Intel Corporation, Santa Clara, Calif. The program code 906 that is executed by the CPU to control the reactor can be written in any conventional computer readable programming language, such as for example, assembly language, C, C++, or Pascal. Suitable program code is entered into a single file, or multiple files, using a conventional text editor and stored or embodied in a computer-usable medium, such as a memory system of the computer. If the entered code text is in a high level language, the code is compiled to a compiler code which is linked with an object code of precompiled windows library routines. To execute the linked and compiled object code, the system user invokes the object code, causing the computer system 900 to load the code in memory to perform the tasks identified in the computer program 906.

Once the code is loaded, the program 906 is executed. Task commands are implemented by the computer system 900 communicating to the various reactor components via one or more communications busses 908. The controllable reactor components include the temperature control assembly 176, the pedestal bias supply 166, the plasma source power 124, the gas supply 130, the heater power supply 172, as well as other systems and subassemblies such as the vacuum pumps, safety lockouts, sensors, plasma control coil power, and the like. All of these components are controlled by the computer system 900 as described above to facilitate high density plasma generation and control.

Use of the various embodiments of the present invention enables the wafer and source to be separated by 7.5 to 25 cm and maintain a uniform plasma throughout the processing of a wafer. Additionally, temperature control provides a very small temperature variation during processing resulting in consistent process results.

Although various embodiments which incorporate the teachings of the present invention have been shown and described in detail herein, those skilled in the art can readily devise many other varied embodiments that still incorporate these teachings.

What is claimed is:

1. A plasma reactor comprising:
    a plasma reaction chamber defined by a side wall, a bottom and a top and containing a workpiece support, said top of said chamber facing said workpiece support;
    a helicon wave high density plasma source in communication with said plasma reaction chamber;
    an anode electrode, affixed to an interior surface of the plasma reaction chamber; and
    at least three toroidal magnets disposed above said workpiece support and positioned proximate said side wall of said chamber that produce at least three magnetic fields within said chamber.

2. The plasma reactor of claim 1 wherein said helicon wave high density plasma source generates a plasma using a helicon wave having either mode 0 or mode 1.

3. The plasma reactor of claim 1 wherein said anode electrode is the top of said plasma reaction chamber and said top is electrically isolated form said side wall.

4. The plasma reactor of claim 1 wherein said helicon wave high-density plasma source is affixed to said top of said plasma reaction chamber.

5. The plasma reactor of claim 1 wherein said anode electrode further comprises a heater.

6. The plasma reactor of claim 1 further comprising:
    an RF bias source is coupled to said workpiece support and said anode electrode.

7. The plasma reactor of claim 1 wherein said anode electrode is cup-shaped.

8. The plasma reactor of claim 1 further comprising:
    a solenoid coil that is located proximate the chamber.

9. The plasma reactor of claim 1 wherein the helicon wave high density plasma source further comprises:
    a bell jar having an open end that is coupled to a hole in the top of the plasma reaction chamber;
    at least one plasma control coil circumscribing the bell jar; and
    an antenna circumscribing the bell jar.

10. The plasma reactor of claim 1 further comprising:
    a temperature control assembly.

11. The plasma reactor of claim 10 wherein said temperature control assembly is mounted proximate the high density plasma source and the top of the plasma reaction chamber.

12. The plasma reactor of claim 11 wherein the temperature control assembly uses liquid vaporization to achieve temperature control of the top and high density plasma source.

13. The plasma reactor of claim 11 wherein the temperature control assembly comprises:
    a cold plate affixed to the top; and
    a cooling jacket circumscribing a portion of the high density plasma source.

14. The plasma reactor of claim 1 wherein the workpiece support is coupled to an actuator for positioning said workpiece support relative to said high density plasma source.

15. The plasma reactor of claim 1 wherein the anode electrode is an annular ring, where a hole in the annular ring is coaxial with the high density plasma source.

16. A plasma reactor comprising:
a plasma reaction chamber defined by a side wall, a bottom and a top and containing a workpiece support for holding a workpiece inside said chamber during processing, said top of said chamber facing said workpiece support;
a helicon wave high density plasma source in communication with said plasma reaction chamber; and
at least three toroidal magnets disposed above said workpiece support and positioned proximate said side wall of said chamber that produce at least three magnetic fields within said chamber.

17. The plasma reactor of claim 16 wherein one or more of said torroidal magnets are solonoidal electromagnets.

18. The plasma reactor of claim 16 wherein said one or more of said torroidal magnets are permanent magnets.

19. The plasma reactor of claim 16 further comprising:
an anode electrode affixed to an interior surface of said top.

20. The plasma reactor of claim 19 wherein said anode electrode is the top of said plasma reaction chamber and said top is electrically isolated form said side wall.

21. The plasma reactor of claim 19 wherein said anode electrode further comprises a heater.

22. The plasma reactor of claim 19 further comprising:
an RF bias source coupled to said workpiece support and said anode electrode.

23. The plasma reactor of claim 16 further comprising:
a solenoid coil located proximate the chamber.

24. The plasma reactor of claim 16 wherein the helicon wave high density plasma source further comprises:
a bell jar having an open end that is coupled to a hole in the top of the plasma reaction chamber;
at least one plasma control coil circumscribing the bell jar; and
an antenna circumscribing the bell jar.

25. The plasma reactor of claim 16 wherein the workpiece support is coupled to an actuator for positioning said workpiece support relative to said helicon wave high density plasma source.

26. The plasma reactor of claim 16 further comprising:
a temperature control assembly.

27. The plasma reactor of claim 26 wherein said temperature control assembly is mounted proximate the high density plasma source and the top of the plasma reaction chamber.

28. The plasma reactor of claim 26 wherein the temperature control assembly uses liquid vaporization to achieve temperature control of the top and helicon wave high density plasma source.

29. The plasma reactor of claim 26 wherein the temperature control assembly comprises:
a cold plate affixed to the top; and
a cooling jacket circumscribing a portion of the high density plasma source.

30. A plasma reactor comprising:
a plasma reaction chamber defined by a side wall, a bottom and a top and containing a workpiece support for holding a workpiece inside said chamber during processing, said top of said chamber facing said workpiece support;
a helicon wave high density plasma source affixed to said top of said plasma reaction chamber; and
a temperature control assembly utilizing liquid vaporization to achieve temperature control, mounted proximate the helicon wave high density plasma source and the top of the plasma reaction chamber.

31. The plasma reactor of claim 30 wherein the temperature control assembly controls the temperature of the sidewall, the high density plasma source and the top of the chamber.

32. The plasma reactor of claim 30 wherein said temperature control assembly comprises:
a vapor chamber enclosing an outer surface of said top and said high density plasma source;
a spray nozzle, located within said vapor enclosure, that sprays a fluid over said surface of said top and said high density source; and
a condensor, located within said vapor enclosure, that condenses fluid vapor evaporated from said surface of said top and said helicon wave high density source.

33. The plasma reactor of claim 32 wherein said temperature control assembly further comprises:
a pressure sensor for monitoring a vapor pressure within said vapor enclosure.

34. The plasma reactor of claim 33 wherein said temperature control assembly comprises:
a pump, coupled to said vapor enclosure, to remove condensed vapor from the vapor enclosure; and
a heater, located between said pump and said spray nozzle, for heating the fluid.

35. The plasma reactor of claim 34 wherein said temperature control assembly comprises:
a controller, coupled to said heater and said pressure sensor, for controlling the temperature of the fluid to establish a predefined vapor pressure within the vapor enclosure.

36. The plasma reactor of claim 30 wherein the temperature control assembly comprises:
a cold plate affixed to the top; and
a cooling jacket circumscribing a portion of the high density plasma source.

37. The plasma reactor of claim 30 wherein the workpiece support is coupled to an actuator for positioning said workpiece support relative to said helicon wave high density plasma source.

38. The plasma reactor of claim 30 further comprising:
an anode electrode affixed to an interior surface of said top.

39. The plasma reactor of claim 38 wherein said anode electrode is the top of said plasma reaction chamber and said top is electrically isolated form said side wall.

40. The plasma reactor of claim 38 wherein said anode electrode further comprises a heater.

41. The plasma reactor of claim 38 further comprising:
an RF bias source coupled to said workpiece support and said anode electrode.

42. The plasma reactor of claim 30 further comprising:
a plurality of toroidal magnets positioned proximate said side wall of said chamber.

43. The plasma reactor of claim 30 further comprising:
a solenoid coil located proximate the chamber.

44. The plasma reactor of claim 30 wherein the high density plasma source further comprises:
a bell jar having an open end that is coupled to a hole in the top of the plasma reaction chamber;
at least one plasma control coil circumscribing the bell jar; and
an antenna circumscribing the bell jar.

* * * * *